United States Patent [19]

Aubert

[11] Patent Number: 4,990,879
[45] Date of Patent: Feb. 5, 1991

[54] MAGNETIC BLOCK WITH ADJUSTABLE MAGNETIZATION FOR PRODUCING A PERMANENT MAGNETIC FIELD IN A ZONE OF INTEREST

[75] Inventor: Guy Aubert, Grenoble, France

[73] Assignee: Centre National de la Recherche Scientifique, Paris, France

[21] Appl. No.: 353,645

[22] PCT Filed: Oct. 13, 1987

[86] PCT No.: PCT/FR87/00391
 § 371 Date: Apr. 14, 1989
 § 102(e) Date: Apr. 14, 1989

[87] PCT Pub. No.: WO88/02922
 PCT Pub. Date: Apr. 21, 1988

[30] Foreign Application Priority Data
 Oct. 17, 1986 [FR] France ................. 86 14416

[51] Int. Cl.$^5$ ............................................. H01F 7/02
[52] U.S. Cl. ....................................... 335/306; 324/318
[58] Field of Search .................. 335/301, 304, 306; 324/318, 319, 320

[56] References Cited

U.S. PATENT DOCUMENTS

| 4,614,730 | 9/1986 | Hickey et al. | 335/306 X |
| 4,692,732 | 9/1987 | Leupold et al. | 335/304 |
| 4,706,057 | 11/1987 | Schwab | 335/304 |
| 4,707,663 | 11/1987 | Minkoff et al. | 335/306 |

FOREIGN PATENT DOCUMENTS

| 0170318 | 2/1986 | European Pat. Off. . | |
| 218180 | 9/1986 | Japan | 335/306 |
| 306175 | 3/1955 | Switzerland . | |
| 447457 | 4/1956 | United Kingdom | 335/306 |

Primary Examiner—George Harris
Attorney, Agent, or Firm—Oblon, Spivak, McClelland, Maier & Neustadt

[57] ABSTRACT

Demagnetization effects in any magnetic block are avoided by using a mixed magnetic material comprising a predetermined proportion of permanently magnetizable magnetic material and of non-magnetic material. The proportion is adjusted as a function of the ratio between the demagnetizing excitation and a so-called cut-off excitation of the material, for which the magnetization of the material drops considerably. Application to imaging by nuclear magnetic resonance.

13 Claims, 3 Drawing Sheets

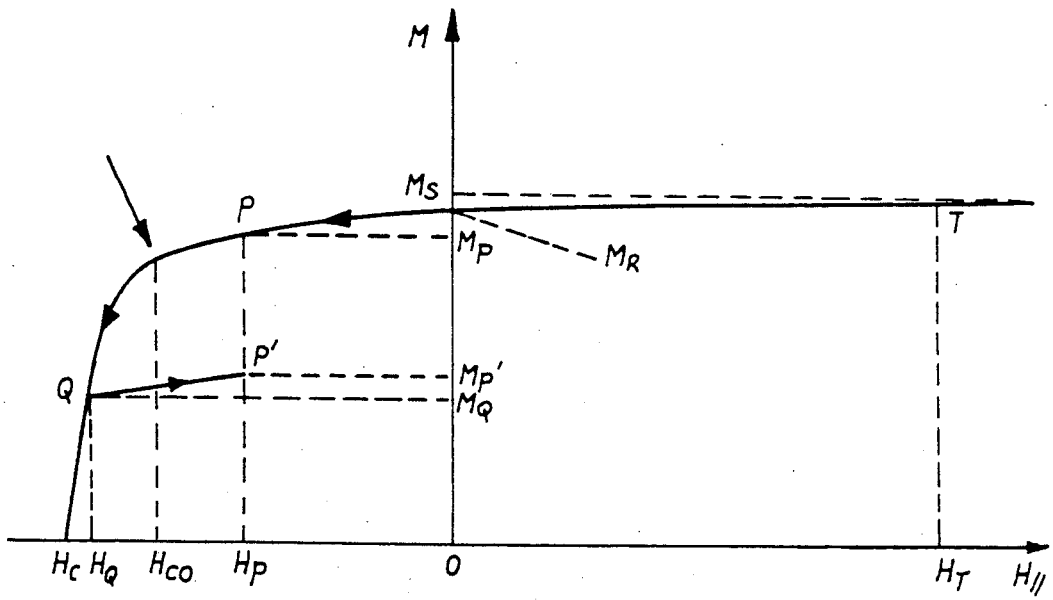
FIG_1
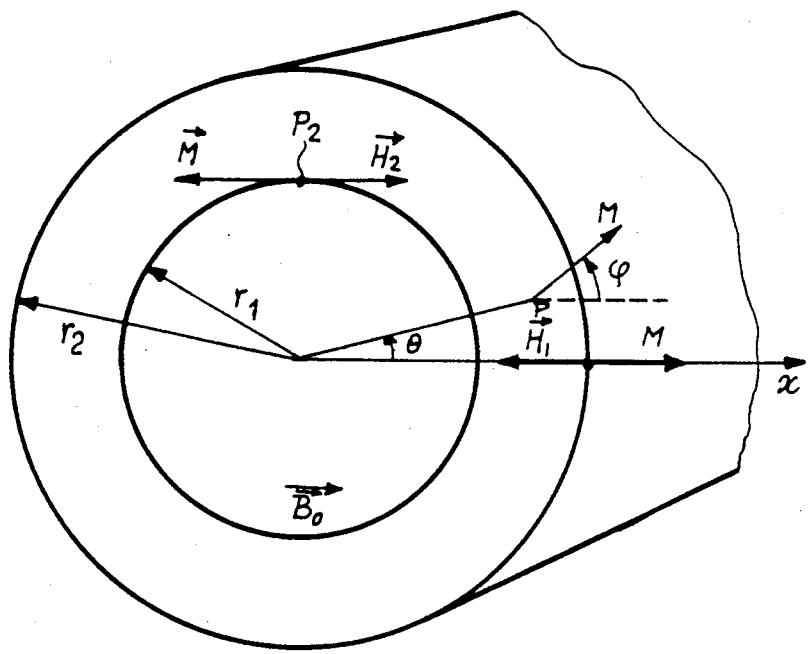
FIG_2

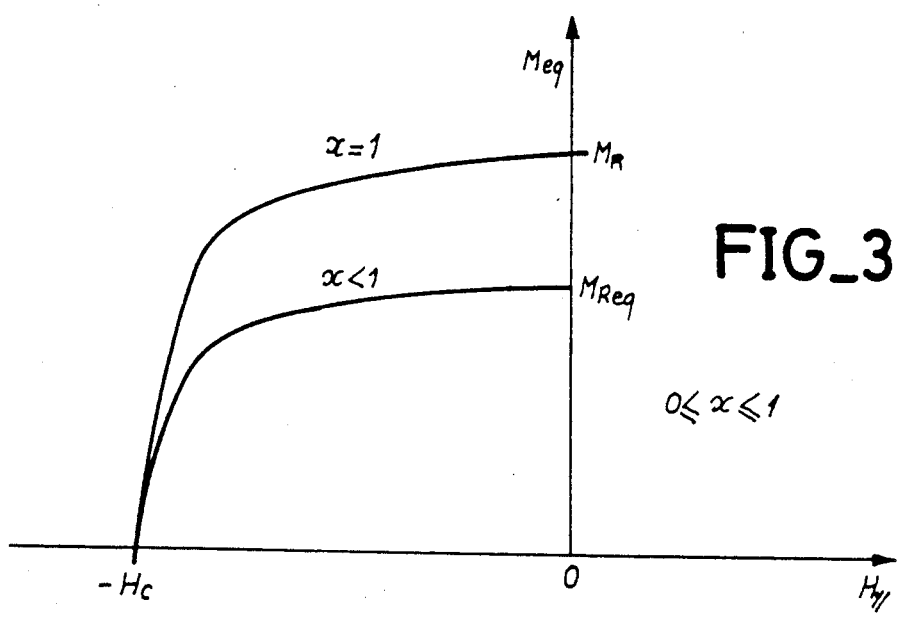
FIG_3
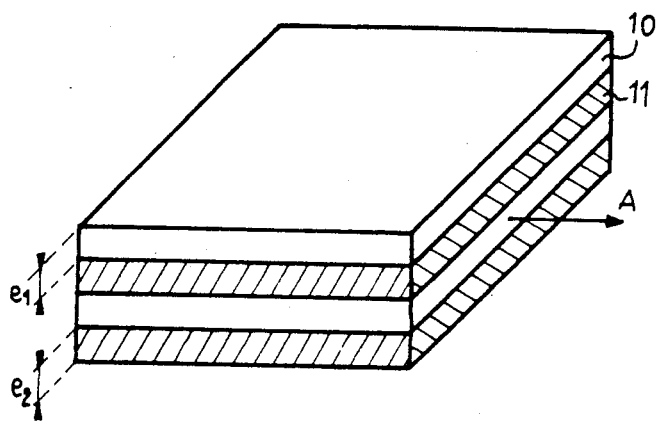
FIG_4-a
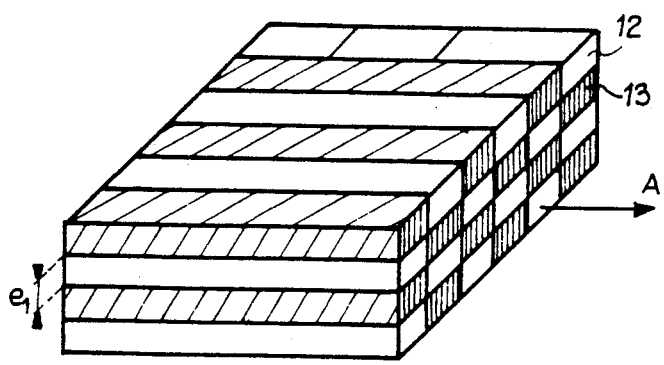
FIG_4-b

FIG_5
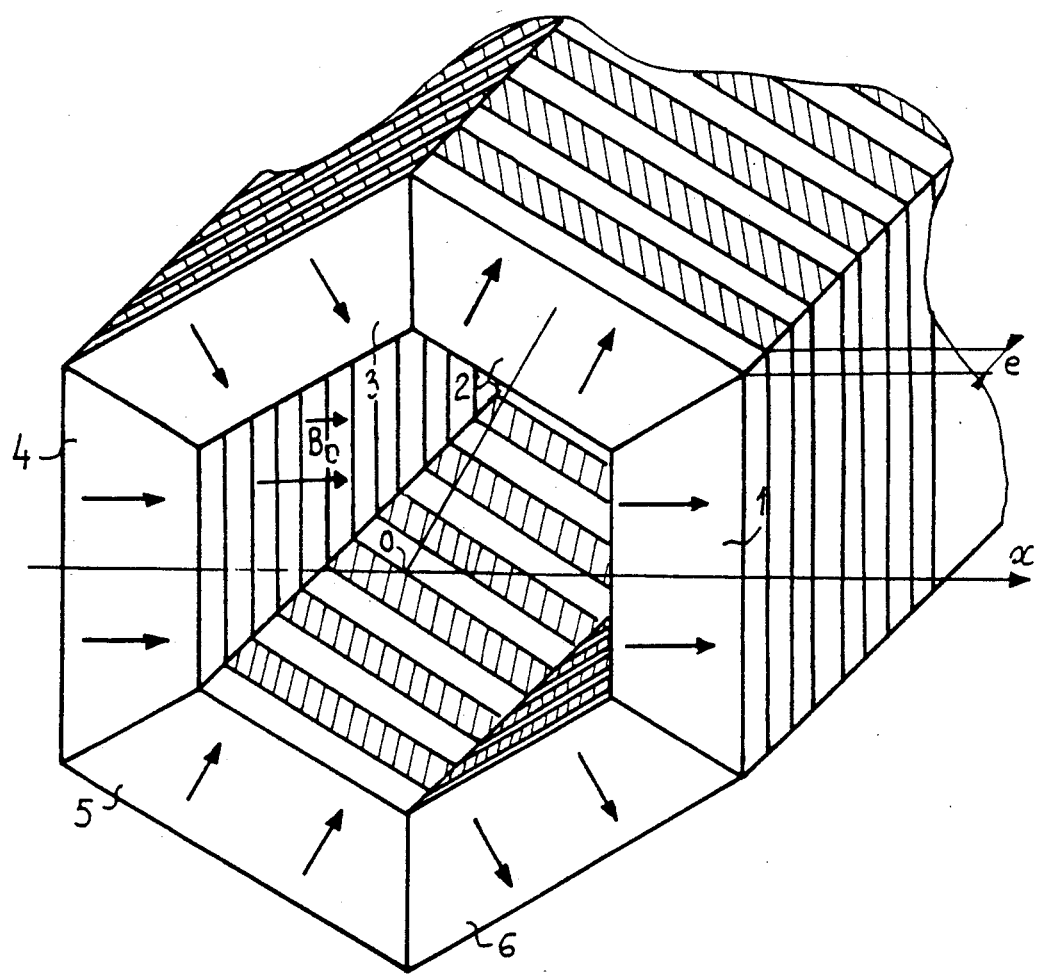

MAGNETIC BLOCK WITH ADJUSTABLE MAGNETIZATION FOR PRODUCING A PERMANENT MAGNETIC FIELD IN A ZONE OF INTEREST

The present invention is due to the *Service National des Champs Intenses*, Director, Mr. Guy AUBERT, and its object is a magnetic block with adjustable magnetization for producing a permanent magnetic field in a zone of interest. It finds application particularly in the medical field where magnets are used in nuclear magnetic resonance imaging experiments. It can also find application in all fields where particular distributions of a magnetic induction field are required.

In the field of imaging by magnetic resonance, it is necessary to place the objects to be imaged, the patients, in a high magnetic induction field (usually of 0.1 to 1.5 Tesla) which is homogenous and uniform (with a few parts per million of variation) in a large volume of interest (commonly a sphere of 50 cm diameter). Several classes of magnetic field generators have been developed until now. The main ones are: superconductive magnets, so-called resistive magnets and permanent magnets. Superconductive magnets, which enable very intense fields to be obtained, are very expensive to make and use because of their complicated technology. They are, furthermore, consumers of rare and dear cryogenic products: like liquid helium. The so-called resistive magnets, with or without associated magnetic material, consume a fairly large amount of electrical energy. They further raise thermal problems of discharge of the heat produced when it is sought to exceed a field of 0.2 Tesla. Permanent magnets have, on the other hand, many advantages.

In particular, they require no energy supply to produce the field. They therefore do not run the risk of drift in their field value due to the drift of these supplies or of the system for discharging the dissipated heat. They call for no particular cooling means with sophisticated regulation techniques for the flow of cryogenic fluids. Their working temperature is easily stabilized. They are furthermore particularly suited to the making of structures or systems that produce a transversal main field, namely a field perpendicular to the direction in which objects, patients, are introduced into the magnet. This arrangement is highly favorable to the making of antennas receiving high gain and highly uniform resonance signals. The main drawback of permanent magnets lies in their weight and cost once it is sought to produce a sufficient field for imaging by NMR.

It is, therefore, particularly important to make the best possible use of the capacities of a given material, namely, to use only the minimum quantity of materials needed to achieve the set objective. Besides, the conditions of homogeneity of the field in the zone of interest are extremely difficult to fulfil, and it is indispensable for the magnetization of the material, at any point of the structure, to be the one that it is desired to achieve in theory. The main difficulty encountered is due to the fact that the magnetized magnetic blocks, which produce the desired magnetic induction field in the zone of interest, produce a magnetic excitation $\vec{H}$ throughout the space and, therefore, also at any point within the material itself. As is well known those skilled in the art, this magnetic excitation $\vec{H}$ at a of the material where the magnetization is $\vec{M}$ is very generally "demagnetizing", namely it can be broken down into a component perpendicular to $\vec{M}$, that is $H_I$ and a component parallel to $\vec{M}$, that is, $H_{//}$, which is directed in the reverse direction of $\vec{M}$. The material should be chosen and used in such a way that, as far as possible, it preserves the magnetization conferred on it during the so-called magnetization process which corresponds to the application of a sufficient magnetic excitation having the direction that it is sought to give to $\vec{M}$.

If the structure of the final magnet is such that, in certain zones occupied by the material, the component $H_I$ is not very small, it is necessary to use, at these places, a material said to have high anistropy, namely, a material, that tends very much to preserve its magnetization aligned in a preferred direction called a direction of easy magnetization or direction of anisotropy. This property of the material is schematically characterized by its field of anisotropy $H_A$ which enables estimation of the angular deviation $\epsilon$ of the magnetization vector $\vec{M}$ of the direction of anistropy along which it has been established, caused by a perpendicular excitation $H_I$ according to the relationship $\epsilon$ substantially equal to $H_I/H_A$, provided that $H_I$ is far smaller than $H_A$. Among marketed materials with high anisotropy, we might cite barium ferrites or strontium ferrites, compounds of rare earths and cobalt such as $SmCo_5$, and materials that have appeared more recently, based on iron, neodymium and boron.

It being assumed that the problem of disturbance of magnetization by a perpendicular excitation has been resolved, if necessary by the use of a material with a sufficient anisotropic field, the fact remains, nonetheless, that the nature of the parallel component $H_{//}$ is also such as to shift the magnitude of the magnetization $\vec{M}$ by the desired value. The curve of FIG. 1 recalls the essential characteristics and materials from this point of view. A volume element having, by application of an appropriate external field, had its internal magnetic excitation brought to the value $H_T$, has been magnetized to a value close to its saturation magnetization $M_S$. This volume element, after elimination of the external field and positioning in the entire set, is subjected to a generally negative (demagnetizing) internal excitation, with a value of $H_P$ for example, which gives it a magnetization $M_P$ corresponding to the point P of a characteristic curve of the material called a demagnetization curve. This takes place on condition, all the same, that the material has never been subjected, since the application of the magnetization excitation $H_T$, to an excitation smaller than $H_P$. In effect, if such were the case and if the volume element considered had undergone at any instant (for example during assembly and because of the influence of other parts of the device) an excitation $H_Q$ smaller than $H_P$ and if it subsequently were to undergo an excitation greater than $H_Q$, for example $H_P$ again, it would recover not the magnetization $M_P$ but a lower magnetization $M_{P'}$ corresponding to a point P' located not on the demagnetization curve, but within it in the second quadrant. It is said that the operating point of the volume element of material is "raised" from Q to P', along a curve with a slightly positive slope called a "return straight line" because it is generally substantially rectilinear. This property is sometimes used to obtain, with a certain internal excitation, for example $H_P$, a smaller magnetization than the maximum possible magnetization $M_P$. This "adjustment" of the magnetization is generally done by applying an external field which is in the reverse direction to the initial magnetization field and is carefully chosen so that, in then "rising"

along the "return straight line", we encounter the desired magnetization values. This method is, one the one hand, difficult to implement and, on the other hand, hardly satisfactory from the economic point of view since it does not use a magnetic material, which is expensive, to its maximum possibilities. One of the advantages of the invention, which shall be discussed further below, is that it presents an alternative to this method of adjustment.

To properly grasp all the potentialities of the invention, it remains necessary to recall some characteristics common to all materials for permanent magnets. The magnetic excitation $H_c$, such that for $-H_c$ a null magnetization is obtained, is called an "intrinsic coercive field" of the material while the magnetization $M_R$ corresponding to a null internal excitation is called "remanent magnetization". The demagnetization curve is marked by the existence of a more or less pronounced elbow depending on the materials (arrow of figure which gives an approximate indication of the level below which value of internal excitation should not fall if it is desired not to make any major and irreversible reduction in the magnetization of the volume element considered. This cut-off excitation $-H_{co}$, leading to a magnetization which is little less than $M_R$, is typically of the order of $-0.7\ H_c$. Certain very valuable structures of permanent magnets practically cannot be made (or lead to disappointments if they are made) because this limit is, unfortunately, exceeded with existing materials. The invention also proposes a solution to this problem in making it possible to ensure that, in no volume element of the material, will a previously fixed limit for internal magnetic excitation be exceeded, knowing the properties of the material used.

The reality of the problem will be better understood in examining a particular example. Structures of permanent magnets producing a uniform magnetic field in a relatively high volume have been described in the prior art. In particular, H. Zijlstra, in an article entitled "Permanent Magnet System for NMR Tomography", published by the Philips Journal of Research, Vol. 40, No. 5, 1985, pp. 259 and ff. as well as a European patent application No. 001 70318 filed on 8th July 1985, published on 5th February 1986 and entitled "Nuclear Magnetic Resonance Apparatus with a Permanent Magnet" has described a cylindrical magnet structure producing a transversal uniform field (even if the length of the cylinder is infinite). It was able to establish the fact that the fact that the field $B_0$, governing the inside of the cylinder, could be theoretically written as:

$$B_0 = \mu_0 M\ \text{Log}\ (r_2/r_1).$$

In this formula M represents the magnetization of the magnetic material used, assumed to have a constant modulus, and making, at any point P, having its position identified by an angle $(Ox, OP) = \Theta$ with a half straight line Ox, an angle $\Phi = 2\Phi$ with Ox, as indicated in figure. Besides, $r_1$ and $r_2$ are the, respectively internal and external, radii of the cylinders forming the magnet. The coefficient $\mu_0$ represents the permeability of the vacuum.

It has been deduced therefrom that, without restriction of weight, the permanent magnets with cylindrical structure "$\Phi = 2\Theta$", approximated by more or less polygonal or more or less prismatic constructions can produce as large fields as desired. In effect, it theoretically suffices to increase the external radius $r_2$ of the cylinder to increase $B_0$ correspondingly. However, the various tests which have been made, putting this theory into practice, show that until now, the results obtained for the value of the field do not correspond to what is laid down by the theory.

The origin of these difficulties must be sought in the problems of demagnetizing excitation recalled further above. We shall restrict the discussion to two particular volume elements, $P_1$ and $P_2$, of FIG. 2. It is very easy to establish that, if the magnetization truly has the desired configuration in the cylinder (same module, $\Phi = 2\Theta$), we have at $P_1$: $H_{1//} = -M$ ($\vec{M}$ is parallel to Ox and has the same direction) and, at $P_2$: $H_{2//} = H_0 = B_0/\mu_0 = M\ \text{Log}\ (r_2/r_1)$ ($\vec{M}$ is here parallel to Ox but has a contrary direction). In both cases $H_{//}$ is measured algebraicly along Ox, therefore in both cases in the reverse direction to $\vec{M}$ ($H_{//}$ is a demagnetizing excitation). It can thus be seen that a structure of this type can be achieved in practice only if there is a material available for which the cut-off excitation $H_{co}$ is greater than $M_R$, and if this is the case irrespectively of the desired field $B_0$ (condition at the point $P_1$) if it is sought to make the best possible use of the material, namely to give the modulus of its magnetization the greatest possible value, hence one close to $M_R$. Even if, and this is already exceptional, a material of this type (a few rare earth-cobalt grades, for example) is available, it will not be possible to increase $r_2$ and therefore $B_0$ to the desired extent, since it would be necessary for the demagnetizing excitation equal to $B_0/\mu_0$ to remain below $H_{co}$ (condition at the point $P_2$). This discussion has been deliberately simplified and restricted to these two particular points but, all the same, it is quite representative of the problem encountered in the designing of a permanent magnet structure.

The invention proposes a solution to this problem in recommending the use of a composite material, the active part of which is always used to its utmost possibilities, but the composition of which brings down the equivalent magnetization in a desired proportion. This result is got by preserving, on the contrary, the coercive field $H_c$ and the cut-off excitation $H_{co}$ of the active basic material. Thus, in resuming the above example, a basic material is available for which $H_{co}$ is not greater than $M_R$, a composition will be chosen for which the equivalent remanent magnetization $M_{Req}$ becomes smaller than $H_{co}$. It will then be enough not to exceed the radius $r_2$ such that $B_0/\mu_0$, equal to $M_{Req}\ \text{Log}\ (r_2/r_1)$ remains $H_{co}$. It is therefore not possible to make as great a field as is desired, but the theoretical structure becomes capable of being achieved in practice.

It should be clearly noted that this reduction in magnetization does not occur by demagnetization of the material, but by reduction of the volume of active material, which is always used to the maximum of its possibilities. This active material is only a certain proportion, smaller than 1, of the volume occupied by the composite material. The reduction is therefore done far more economically while at the same time ensuring that it has greater reproducibility. In effect, to obtain it, it is enough to apply the sufficient field of magnetization to the composite material without having to apply, as in the case of the partly demagnetized original material, a demagnetization field which is very difficult to adjust. Furthermore, the possibility of making, from only one basic material, a composite material with an adjustable demagnetization curve, opens up a new field for the invention of new structures where this possibility of adjustment is turned to advantage. FIG. 3 shows one of the curves of a group of curves in an unlimited number which it is possible to obtain. The curves are deduced by an similarity of relationship x, $0 < x < 1$ of the curve ($x = 1$) of demagnetization of the basic material. Finally, in the case of the use of an anisotropic basic material, the method of fabrication of the composite also preserves all the anisotropic properties. This means that the composite has the same field of anisotropy $H_A$ as the basic material.

Consequently, the invention concerns a magnetic block with adjustable magnetization for the production of a permanent magnetic field in a zone of interest, having determined proportions of permanently magnetizable material and of non-magnetizable material, characterized in that the proportion of magnetizable material in the block is such that the demagnetizing excitation prevailing in this block is substantially smaller than or equal to the cut-off excitation of this magnetizable material.

The invention will be better understood from the reading of following description and from the figures that accompany it. These are given purely by way of indication and in no way restrict the scope of the invention. These figures show:

FIGS. 1 to 2: the state of the art;

FIG. 3: demagnetization curves of a composite material according to the invention;

FIGS. 4a and 4b: exemplary embodiments of a composite block according to the invention;

FIG. 5: an example of the use of a composite material according to the invention in an application of imaging by NMR.

FIGS. 4a or 4b show two possible embodiments, among others, of a magnetic block according to the invention. The magnetization therein is reduced, for example by half, as compared with the magnetization of a basic material 10 shown without hatched lines. This magnetic material is present in the form of plates such as 10 (FIG. 4a) or bars such as 12 (FIG. 4b) separated from one another by a non-magnetic material, respectively plates 11 and bars 13. This non-magnetic material may be, for example, PVC or epoxy resin. The plates 10, or the bars 12, 13, can be bonded together with a bonder or an appropriate resin to ensure the rigidity of the set. The construction of a magnetic block can also be obtained by maintaining the ends of the plates or bars in ties. In a preferred way, to ensure the rigidity of the block, epoxy resin can be cast between the plates or the bars and the straps. The section of the plates or bars, measured perpendicularly to the direction of magnetization A, (which is, therefore, necessarily the direction of anisotropy for an anisotropic material) may be of any shape (rectangular in the case of FIGS. 4a and 4b).

Along this direction A, for reasons of convenience of industrial manufacturing, the plates or bars may consist of several elements placed end to end. But it is imperative that no physically measurable space should be created between these elements. In practice, the space between these elements should not exceed 1/10th of a millimeter. As for the dimensions of the sections of elements (plates or bars) along the direction perpendicular to the direction of magnetization, at least one of these dimensions (thickness of the plate, diameter of a circular section bar, etc.) should be small enough. Typically it should be, at most, 10th or 1/20th of the radius of the sphere of interest where the magnetic induction produced by this magnet should prevail. The demagnetization curve of a magnetic block thus formed is deduced from that of the basic material as indicated above in FIG. 3 with the affinity x. This affinity is equal to the ratio between the area of the section of the magnetic material and the total area of the section perpendicular to the direction of magnetization.

FIG. 5 illustrates the use of magnetic blocks of this type in a structure of a magnet, described besides in another patent application, filed on the same day by the applicant. A set of prismatic blocks 1 to 6 forms a cylindrical structure with a regular polygonal section, (in this case a hexagonal crown). Each section with a trapezoidal section has a magnetization directed in parallel to the radius which defines the position of its median plane. The value of this magnetization is proportionate to the cosine of the angle of reference of this radius with an axis Ox. The angles defining the position of the blocks are therefore multiples of 60° and therefore lead to proportions of $\frac{1}{2}$ since cos 60° is equal to $\frac{1}{2}$. In the patent application thus referred to, it is shown that this distribution of magnetization is liable to cause the existence of a uniform and transversal field $B_0$ within the cylinder. The structure of the magnet could be made with a magnetic material which entirely forms the blocks and 4, while the blocks 2, 3, 5 and 6 are made of a composite material using this same material and a non-magnetic material in proportions of $\frac{1}{2}$ and $\frac{1}{2}$ respectively. For example, the structure can be made with a single type of trapezoidal plates made of magnetic material. The thickness e of these plates is of the order of 1 cm for a diameter of access into the cylinder of some tens of centimeters. The plates are magnetized in their plane, perpendicularly to the two parallel sides of the trapezoid. The blocks 1 and 4 are formed by contiguous stacks of these plates while the blocks 2, 3, 5 and 6 are formed by alternating stacks of these magnetized plates with plates of the same dimension but made of non-magnetic material. In the example examined, it is therefore ascertained that, to make the blocks 2, 3, 5 and 6, a twice smaller amount of magnetic material has been used than if there had been made, for these blocks, blocks identical to 1 to 4 but partially demagnetized by the application of a suitable field to give them magnetization reduced by half.

Finally, we might mention the possibility, provided by the invention, of adjusting differences which are always possible among different manufactured batches of a given material. In effect, it is common, in industrial conditions, to observe differences of several percentage points in the magnetic properties of different batches of one and the same material. The property of causing variation, continuously, in the thickness of the plates or the dimensions of the bars of magnetic materials and non-magnetic materials used, enables the making of identical composite blocks with equal equivalent magnetization even if the magnetic material forming them are not so. This may prove to be a determining advantage for the making of permanent magnets of great homogeneity.

In conclusion, the absolute value $|H_d|$ of the demagnetizing excitation that should prevail in a given place should be smaller than the cut-off excitation of the magnetic material used. Since this demagnetizing excitation is related to the equivalent magnetization $M_{req}$ ($M_{Req} = M_R$ if $x = 1$) of the material itself, this equivalent magnetization should be set so that $H_d$ becomes smaller than $H_{co}$ Two cases may occur. In a first case, $H_d$ is smaller than $H_{co}$: the magnetic material may be used by itself. In a second case, the use of this material alone leads to excessively high demagnetizing excitation, and the proportion of this magnetic material has to be reduced so that there is thereby caused a new demagnetizing excitation smaller than the limit $H_{co}$. The proportion is then equal to the ratio of the new and old demagnetizing excitations: this means that it is equal, at most, to the ratio of the cut-off excitation $H_{co}$ to this demagnetizing excitation $H_d$ to be avoided. In another words, the example referred to in the state of the art, by reducing the proportion of magnetic material everywhere, there is definitely obtained a uniform field $B_0$ (which, however, has reduced value).

I claim:

1. A magnetic block with adjustable magnetization, said block being part of a set of blocks, said set of blocks constituting a structure of a magnet designed for the production of a permanent magnetic field ($B_0$) in a zone of interest (V) of said magnet, said magnetic block comprising determined proportions (x) of permanently magnetizable material and of non-magnetizable material, wherein the proportion of magnetizable material in said block is such that the absolute value of a demagnetizing excitation ($H_d$) that prevails in a given place of said structure is at the most equal to the cut-off excitation ($H_{co}$) of said magnetizable material.

2. Block according to claim 1, characterized in that the proportion varies as a function of the value of the field to be produced in the zone of interest and of the corresponding magnetization of the block.

3. Block according to any one of the claims 1 or 2, characterized in that it comprises pieces (10, 12) of the constituent material of the magnetizable material, for which the direction (A) favored by magnetic anisotropy is oriented in the magnetization direction (M) to be produced at the location of these pieces.

4. Block according to claim 3, characterized in that one dimension of the pieces ($e_1$), orthogonal to the direction of the magnetization (M), is substantially equal to a tenth of the dimension of the zone of interest (V).

5. Block according to claim 4, characterized in that this dimension is equal to about one twentieth of the dimension of the zone of interest.

6. Block according to any one of the claims 1 to 2, characterized in that the magnetizable and non-magnetizable materials are present in the form of plates (7, 8) attached to one another, the direction of the magnetization (M) therein being parallel to the plates.

7. Block according to any one of the claims 1 to 2, characterized in that the magnetizable materials are present in the form of bars (9), the direction of magnetization being parallel to the large dimension of the bars.

8. Block according to any one of the claims 1 to 2, characterized in that the magnetizable material is present in the form of bars embedded in a non-magnetizable material, the direction of magnetization being parallel to the large dimension of the bars.

9. Block according to any one of the claims 1 to 2, characterized in that the magnetizable material is present in the form of pieces aligned with one another in the direction of the magnetization to be produced.

10. Block according to any of the claims 1 to 2, characterized in that the magnetizable material is a ferrite.

11. Block according to any one of the claims 1 to 2, characterized in that the magnetizable material is a material based on rare earths and cobalt.

12. Block according to any one of the claims 1 to 2, characterized in that the magnetizable material is a material based on iron-neodymium-boron.

13. A magnetic block with adjustable magnetization for the production of a permanent magnetic field ($B_0$) in a zone of interest (V), comprising determined proportions (x) of permanently magnetizable material and of non-magnetizable material, characterized in that the proportion of magnetizable material in the block is such that the demagnetizing excitation ($H_d$) which prevails in said block is at most equal to the cut-off excitation ($H_{co}$) of said magnetizable material, said block further comprising pieces of said constituent material of said magnetizable material for which the direction (A) favored by magnetic anisotropy is oriented in the magnetization direction (M) to be produced at the location of said pieces and wherein one dimension of said pieces, which dimension is orthogonal to the direction of the magnetization (M), is at most equal to 0.1 times the dimension of the zone of interest (V).

* * * * *